United States Patent
Haskell et al.

[11] Patent Number: 5,920,787
[45] Date of Patent: Jul. 6, 1999

[54] SOFT EDGE INDUCED LOCAL OXIDATION OF SILICON

[75] Inventors: Jake Haskell, Palo Alto; Olivier Laparra, San Jose; Jie Zheng, Palo Alto, all of Calif.

[73] Assignee: VLSI Technology, Inc., San Jose, Calif.

[21] Appl. No.: 08/783,312

[22] Filed: Jan. 15, 1997

[51] Int. Cl.$^6$ .................................................. H01L 21/76
[52] U.S. Cl. ........................ 438/425; 438/424; 438/443; 148/DIG. 50
[58] Field of Search ................................ 438/444, 445, 438/446, 443, 424, 425, 435; 148/DIG. 50

[56] References Cited

U.S. PATENT DOCUMENTS

| | | | |
|---|---|---|---|
| 4,679,304 | 7/1987 | Bois | 438/426 |
| 4,835,115 | 5/1989 | Eklund | 438/426 |
| 5,106,777 | 4/1992 | Rodder | 438/426 |
| 5,468,676 | 11/1995 | Madan | 438/426 |
| 5,731,221 | 3/1998 | Kwon | 148/DIG. 50 |

*Primary Examiner*—Trung Dang
*Attorney, Agent, or Firm*—Wagner, Murabito, & Hao

[57] ABSTRACT

A semiconductor device isolating structure and method for forming such a structure. In one embodiment, the semiconductor device isolating structure of the present invention includes a trench formed into a semiconductor substrate. A cross-section of the trench has a first sidewall extending to the bottom surface of the trench, and a second sidewall extending to the bottom surface of the trench. Furthermore, the trench of the present invention also has a first field oxide region formed proximate to the interface of the first sidewall and the top surface of the semiconductor substrate, and a second field oxide region formed proximate to the interface of the second sidewall and the top surface of the semiconductor substrate. As a result, the semiconductor substrate has a first rounded corner formed at the intersection of the top surface of semiconductor substrate and the first sidewall, and a second rounded corner formed at the intersection of the top surface of the semiconductor substrate and the second sidewall. In so doing, the present invention eliminates the sharp upper corners found in conventional trenches formed using prior art shallow trench isolation methods.

13 Claims, 6 Drawing Sheets

SOFT EDGE INDUCED LOCAL OXIDATION OF SILICON

TECHNICAL FIELD

The present claimed invention relates to the field of semiconductor devices. More specifically, the present claimed invention relates to semiconductor device isolating structures.

BACKGROUND ART

As process technology has been evolving to submicron geometries, Shallow trench isolation (STI) has been gradually replacing conventional semiconductor device isolating methods such as, for example, local oxidation of silicon (LOCOS). STI provides several major advantages over LOCOS methods. For example, STI methods allow for higher device density by decreasing the required width of the semiconductor device isolating structure. As yet another benefit, STI enhances surface planarity which, in turn, considerably improves critical dimension control during lithography steps.

Referring now to Prior Art FIGS. 1A–1C, side-sectional views illustrating steps used in a prior art STI process are shown. As shown in Prior Art FIG. 1A, a substrate 100 has an oxide 102 and nitride 104 stack formed thereon. The oxide 102 and nitride 104 stack is used as a mask.

As shown in Prior Art FIG. 1B, using conventional masking and photolithography steps, a typical STI process forms an opening 106 extending through the oxide 102 and nitride 104 stack. Opening 106 extends to the top surface of semiconductor substrate 100.

Referring next to FIG. 1C, in a conventional STI process, a plasma etch or other type of dry etch is then used to etch an opening or "trench" 108 into semiconductor substrate 100. In a conventional STI process, a common etch chemistry of chlorine and hydrogen bromide ($Cl_2$/HBr) is used to etch trench 108 into semiconductor substrate 100. As shown in the cross-sectional view of trench 108 in Prior Art FIG. 1C, a conventional STI process results in the formation of a trench 108 having micro-trenches 110 and 112 formed into the bottom surface thereof. Thus, a trench formed by a conventional STI process does not have a substantially planar bottom surface. As a result, when a prior art trench 108 is subsequently filled with dielectric material, voids are often created in and around micro-trenches 110 and 112. Such voids reduce semiconductor device isolation effectiveness and device reliability.

As yet another drawback, trench 108, formed by a conventional STI process, has a vertical sidewall profile. That is, sidewalls 113a and 113b are vertically oriented. As a result, adhesion of subsequently deposited dielectric material to sidewalls 113a and 113 is adversely affected. Poor adhesion of the dielectric material to sidewalls 113a and 113b compromises the integrity of the semiconductor isolating device.

Referring still to Prior Art FIG. 1C, conventionally fabricated trench 108 contains yet another substantial disadvantage. Namely, the interface of vertically oriented sidewalls 113a and 113b and the top surface of semiconductor substrate 100 produces sharp corners 114 and 116. As a result, stress in the contact between subsequently deposited dielectric material and semiconductor substrate 100 is generated at sharp corners 114 and 116. Such sharp corners 114 and 116 and resultant stresses contribute to poor leakage protection and poor gate oxide integrity.

Thus, a need exists for semiconductor decive isolating structure which does not have sharp stress-generating corners. A need also exists for a semiconductor device isolating structure which does not have micro-trenches formed therein. A further need exists for a semiconductor device isolating structure which enhances sidewall bonding of a dielectric material thereto.

DISCLOSURE OF THE INVENTION

The present invention provides a semiconductor device isolating structure which does not have sharp stress-generating corners. The present invnention also provides a semiconductor device isolating structure which does not have micro-trenches formed therein. Additionally, the present invention also provides a semiconductor device isolating structure which enhances sidewall bonding of a dielectric material thereto. The present invention achieves the above accomplishments with a soft edge induced local oxidation of silicon formed structure having ideal physical characteristics.

Specifically, in one embodiment, a semiconductor device isolating structure and method for forming such a structure is disclosed. In the present embodiment, the semiconductor device isolating structure of the present invention includes a trench formed into a semiconductor substrate. A cross-section of the trench has a first sidewall extending to the bottom surface of the trench, and a second sidewall extending to the bottom surface of the trench. Furthermore, the trench of the present invention also has a first field oxide region formed proximate to the interface of the first sidewall and the top surface of the semiconductor substrate, and a second field oxide region formed proximate to the interface of the second sidewall and the top surface of the semiconductor substrate. As a result, the semiconductor substrate has a first rounded corner formed at the intersection of the top surface of semiconductor substrate and the first sidewall, and a second rounded corner formed at the intersection of the top surface of the semiconductor substrate and the second sidewall. In so doing, the present invention eliminates the sharp upper corners found in conventional trenches formed using prior art shallow trench isolation methods.

In another embodiment of the present invention, a trench forming method in accordance with the present claimed invention is disclosed. In such an embodiment, an opening is formed in a mask layer overlying a semiconductor substrate such that a first region of the semiconductor substrate is exposed. Next, a field oxide structure is growing on the first region of the semiconductor substrate. The field oxide structure extends beyond the first region of the semiconductor substrate such that a portion of the field oxide structure extends under the mask layer overlying the semiconductor substrate. The present method then etches, within a first etching environment, the field oxide residing on the first region of the semiconductor substrate. The present invention then etches, within a second etching environment, a trench of a desired depth into the semiconductor substrate at the first region. After the trench has been formed, the trench is filled with a dielectric material. The present invention then removes excess dielectric material such that the dielectric material is substantially coplanar with the top surface of the mask layer disposed above the semiconductor substrate. Then, the present invention removes the mask layer such that a semiconductor isolating device is formed into and extends above the semiconductor substrate.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

Prior Art

Prior Art

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
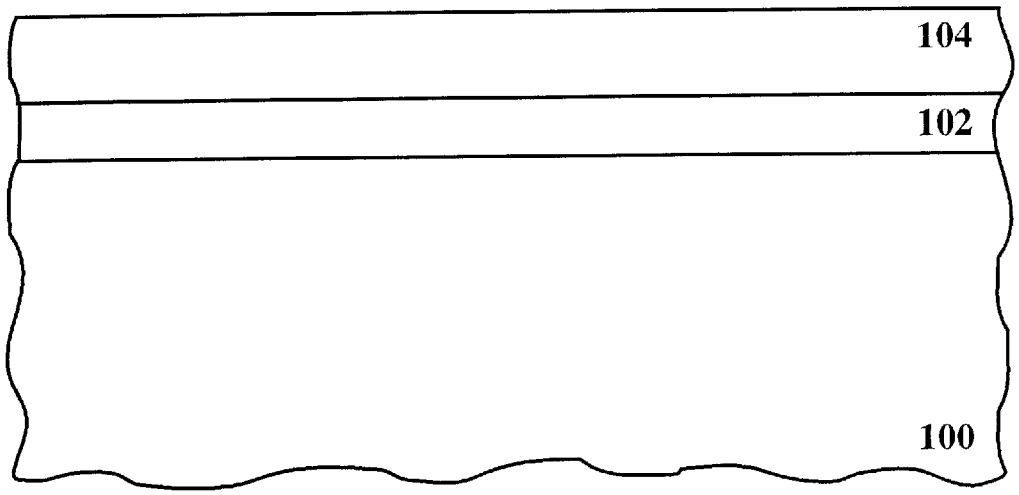
FIG. 1A is a cross-sectional view illustrating steps associated with a prior art STI process.
Figure 1B:
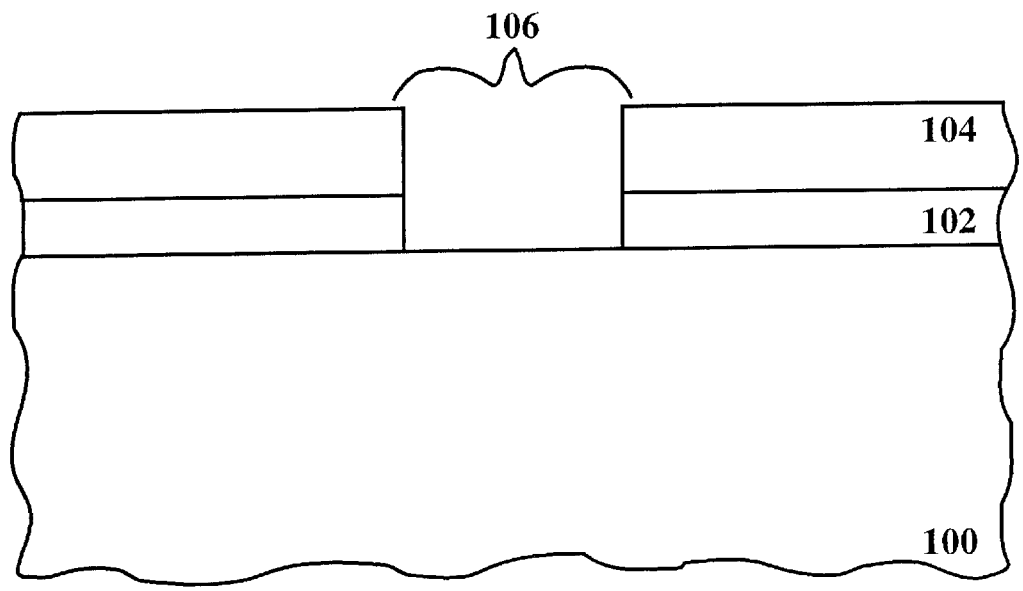
FIG. 1B is a cross-sectional view illustrating steps associated with a prior art STI process.
Figure 1C:
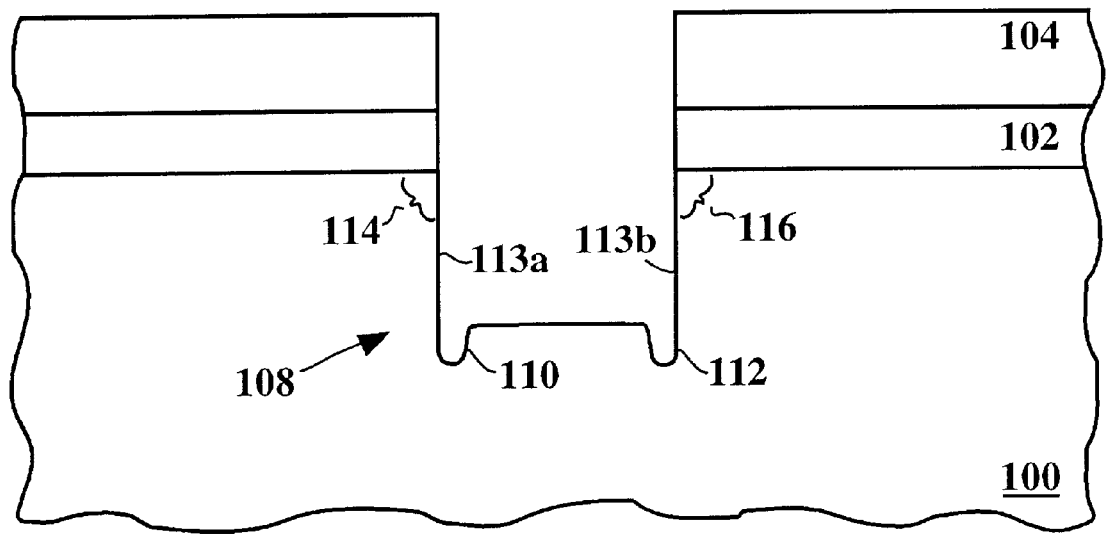
FIG. 1C is a cross-sectional view illustrating steps associated with a prior art STI process.
Figure 2A:
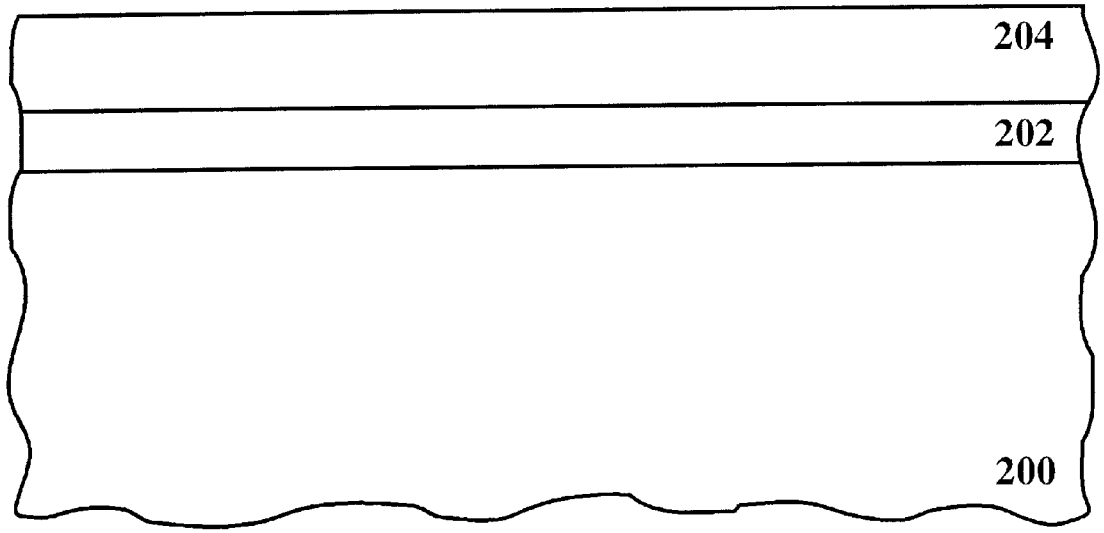
FIG. 2A is a cross-sectional view illustrating steps associated with the formation of a semiconductor device isolating structure in accordance with the present claimed invention.

The following discussion will pertain to cross-sectional views of a semiconductor device isolating structure in various states of fabrication. With reference now to FIG. 2A, a semiconductor substrate 200 such as, for example, silicon, is covered by stack comprised of an oxide layer 202 and a nitride layer 204. For purposes of the present application, the stack overlying semiconductor substrate 200 is referred to as a "mask layer." Although such a semiconductor substrate and stack is specified in the present embodiment, the present invention is also well suited to various other semiconductor materials, and various other stack layers.

Figure 2B:
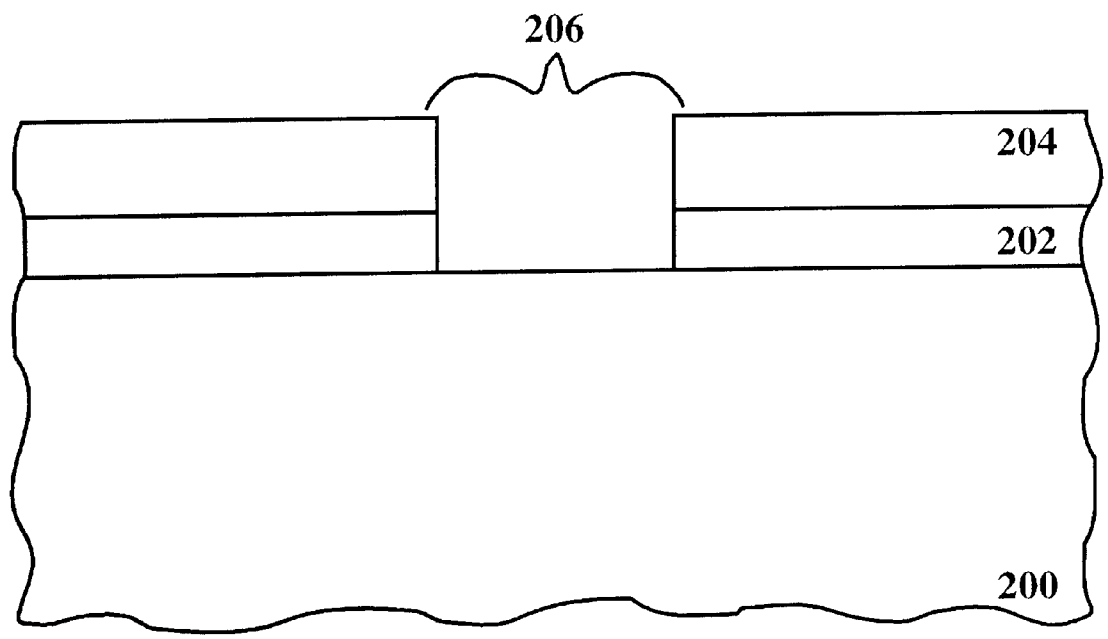
FIG. 2B is a cross-sectional view illustrating a step associated with the formation of a semiconductor device isolating structure in accordance with the present claimed invention.

Referring now to FIG. 2B, the present invention removes a portion of the mask layer. In so doing, a first region 206 of semiconductor substrate 200 is exposed. The present invention removes a portion of the mask layer using a plasma etch. Although such an etching method is used in the present embodiment, the present invention is also well suited to using various other methods to form the opening in the mask layer.

Figure 2C:
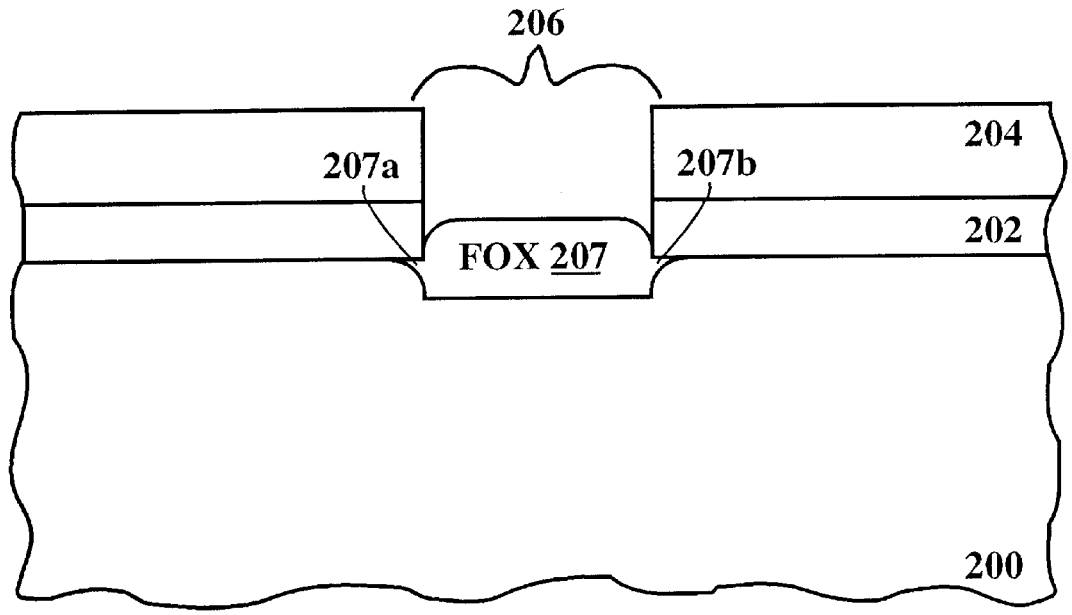
FIG. 2C is a cross-sectional view illustrating a step associated with the formation of a semiconductor device isolating structure in accordance with the present claimed invention.

Referring next to FIG. 2C, the present invention grows a field oxide (FOX) structure 207 on region 206 of semiconductor substrate 200. As shown in FIG. 2C, FOX structure 207 includes portions 207a and 207b which extend beyond region 206 of semiconductor substrate 200. That is, portions 207a and 207b of FOX structure 207 extend under the mask layer overlying semiconductor substrate 200. As shown in FIG. 2C, the regions of semiconductor substrate 200 near portion 207a and 207b have a smooth rounded contour.

Figure 2D:
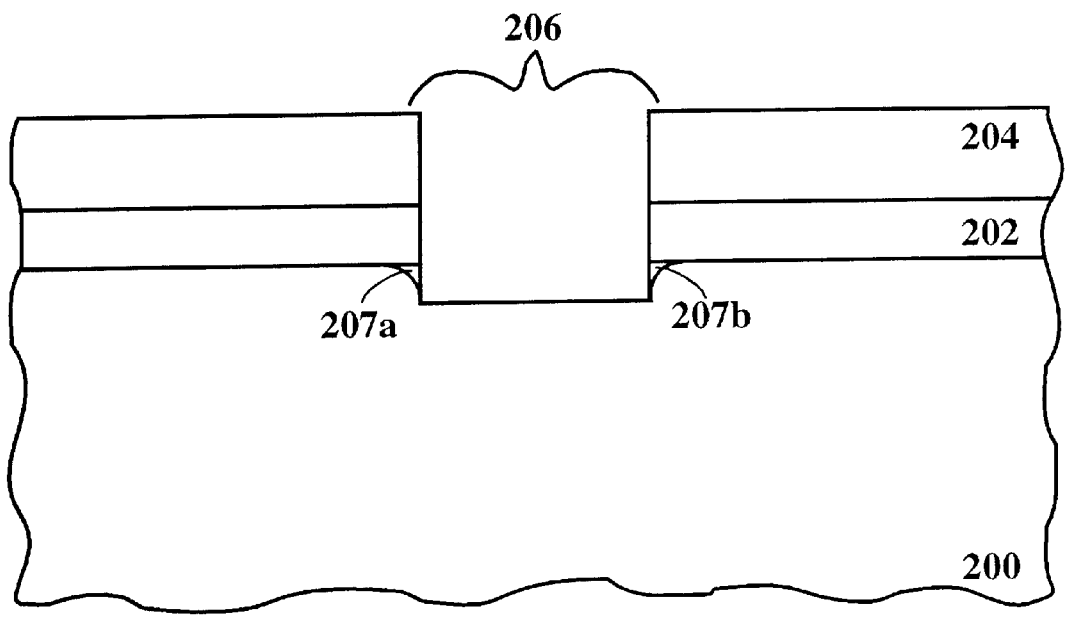
FIG. 2D is a cross-sectional view illustrating a step associated with the formation of a semiconductor device isolating structure in accordance with the present claimed invention.

With reference next to FIG. 2D, the present invention then etches that portion of FOX 207 grown at region 206 of semiconductor substrate 200. The present invention does not remove portion 207a or portion 207b residing under the mask layer overlying semiconductor substrate 200. Thus, FOX regions 207a and 207b remain even though the rest of FOX 207 is etched as shown in FIG. 2D. In the present embodiment, a plasma etching environment of $C_2F_6$ is used to etch the selected portion of FOX 207 from region 206 of semiconductor substrate 200. Although such an etching method and environment is used in the present embodiment, the present invention is also well suited to using various other etching methods and enviroments to etch the selected portion of FOX 207 from region 206 of semiconductor substrate 200.

Referring still to FIG. 2D, semiconductor substrate 200 and the overlying mask layer comprised of oxide layer 202 and nitride layer 204 are exposed to a second plasma etching environment. Unlike the $Cl_2$/HBr etching environment of conventional shallow trench isolation processes, in the present embodiment, the etching environment is comprised of helium, oxygen, chlorine, and hydrogen bromide. More specifically, the present embodiment introduces helium into the etching environment at a rate of 100 standard cubic centimeters per minute (sccm). The present embodiment also introduces, into the etching environment, oxygen at a rate of 5 sccm, chlorine at a rate of 70 sccm, and hydrogen bromide at a rate of 70 sccm. Although such rates are used in the etching environment of the present invention, the present invention is also well suited to using various other rates. That is, the present invention is well suited to varying the rates such that helium is introduced into the etching environment at a rate in the range of 80–180 sccm. The present invention is also well suited to introducing oxygen into the etching environment at a rate in the range of 2–5 sccm; introducing chlorine into the etching environment at a rate in the range of 50–100 sccm; and introducing hydrogen bromide into the etching environment at a rate in the range of 50–100 sccm.

Figure 2E:
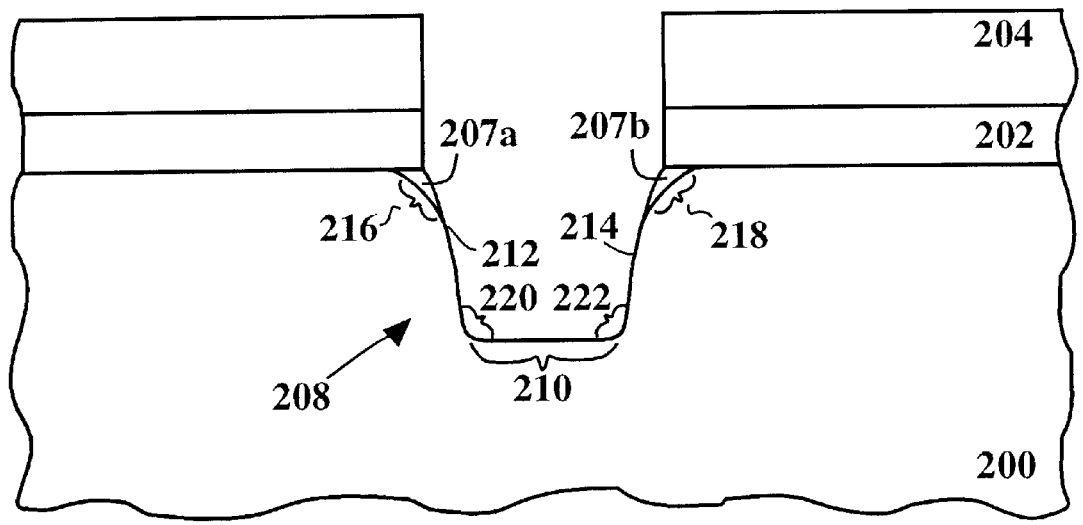
FIG. 2E is a cross-sectional view illustrating a step associated with the formation of a semiconductor device isolating structure in accordance with the present claimed invention.

Referring next to FIG. 2E, as shown in the cross-sectional view, a trench 208 is formed in semiconductor substrate 200 by the second plasma etching environment. Trench 208 of the present semiconductor device isolating structure has an idealized profile. That is, trench 208 of the present invention has a substantially planar bottom surface 210. More specifically, the present etching environment generates a trench 208 which does not have micro-trenches formed therein. Thus, the present etching environment eliminates micro-trench formation. Hence, deposition of a dielectric material into trench 208 does not result in the formation of voids therein.

Referring still to FIG. 2E, trench 208 of the present invention has several other substantially advantageous features. As one example, in cross-sectional view, trench 208 has inwardly sloping sidewalls 212 and 214. That is, sidewalls 214 and 214 slope inwardly towards the center of substantially planar bottom surface 210. The present etching environment causes an oxide-rich polymer to be formed during the etching of trench 208. The oxide-rich polymer is attracted to nitride, and thus initially coats the vertically oriented portion of nitride layer 204. This oxide-rich polymer coating process continues until the vertically oriented portion of nitride layer 204 is fully coated with the oxide-rich polymer. As a result, the oxide-rich polymer disposed on the side of nitride layer 204 "shields" that portion of semiconductor substrate 200 which underlies the oxide-rich polymer. Hence, in the present etching environment, the rate at which semiconductor substrate 200 is etched varies as a function of the distance from the vertical oriented portion of nitride layer 204. In the present embodiment, sidewalls 212 and 214 slope inwardly towards the center of substantially planar bottom surface 210 at an angle in the range of 60–80 degrees. Unlike the vertically oriented sidewalls found in grooves formed using a conventional STI process, sloped sidewalls 212 and 214 of trench 208 facilitate and enhance the attachment of dielectric material thereto.

Referring yet again to FIG. 2E, the cross-sectional view of trench 208 illustrates another substantially advantageous feature of the present invention. Namely, the previous formation of FOX 207 of FIGS. 2C causes semiconductor substrate 200 to have rounded upper corners 216 and 218 formed therein. As a result, trench 208 of the present invention has smooth rounded upper corners 216 and 218 at the interface of sloped sidewalls 212 and 214, respectively, and the top surface of semiconductor substrate 200. In so doing, trench 208 of the present invention drastically reduces stress in the contact between subsequently deposited dielectric material and semiconductor substrate 200 at upper corners 216 and 218. Furthermore, smooth rounded bottom corners 220 and 222 further facilitate and enhance coating and bonding of subsequently deposited dielectric material to trench 208.

Figure 2F:
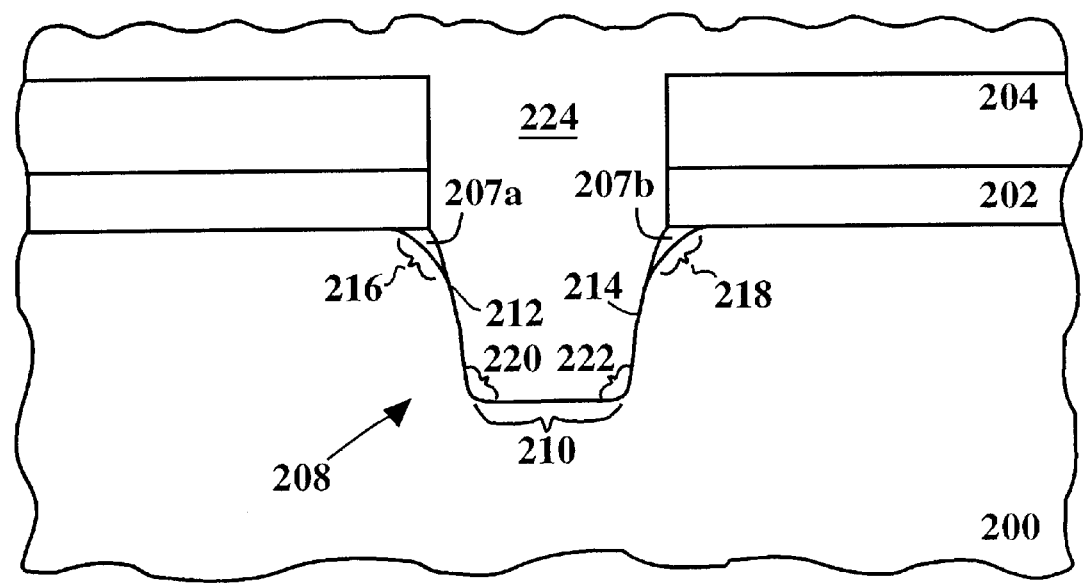
FIG. 2F is a cross-sectional view illustrating a step associated with the formation of a semiconductor device isolating structure in accordance with the present claimed invention.

Referring now to FIG. 2F, after the formation of trench 208, dielectric material 224 is deposited therein. In the present embodiment, dielectric material 224 is deposited into trench 208 via a low pressure chemical vapor deposition (LPCVD). As a result, dielectric material 224 is deposited into trench 208 and over the top surface of nitride layer 204. In the present embodiment, dielectric material 224 is comprised of silicon dioxide. Although such a dielectric material is used in the present embodiment, the present invention is also well suited to having various other dielectric materials deposited into trench 208.

Figure 2G:
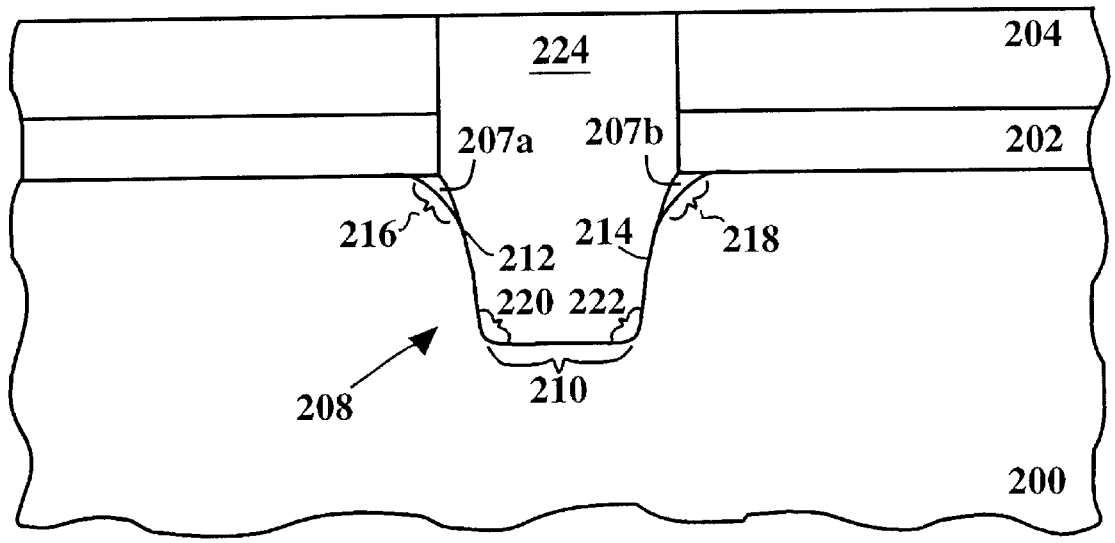
FIG. 2G is a cross-sectional view illustrating a step associated with the formation of a semiconductor device isolating structure in accordance with the present claimed invention.

With reference next to FIG. 2G, after the deposition of dielectric material 224, excess dielectric material is removed. In the present embodiment, the excess dielectric material is removed using a chemical mechanical polishing (CMP) process. The top surface of nitride layer 204 acts as a stop for the CMP process in the present embodiment. Thus, the top surface of dielectric material 224 deposited into trench 208 is coplanar with the top surface of nitride layer 204. Therefore, the present invention maintains a planar topography even after the formation of the semiconductor isolating device. Although a CMP process is used to remove the excess dielectric material in the present embodiment, the present invention is also well suited to using various other methods to remove the excess dielectric material.

Figure 2H:
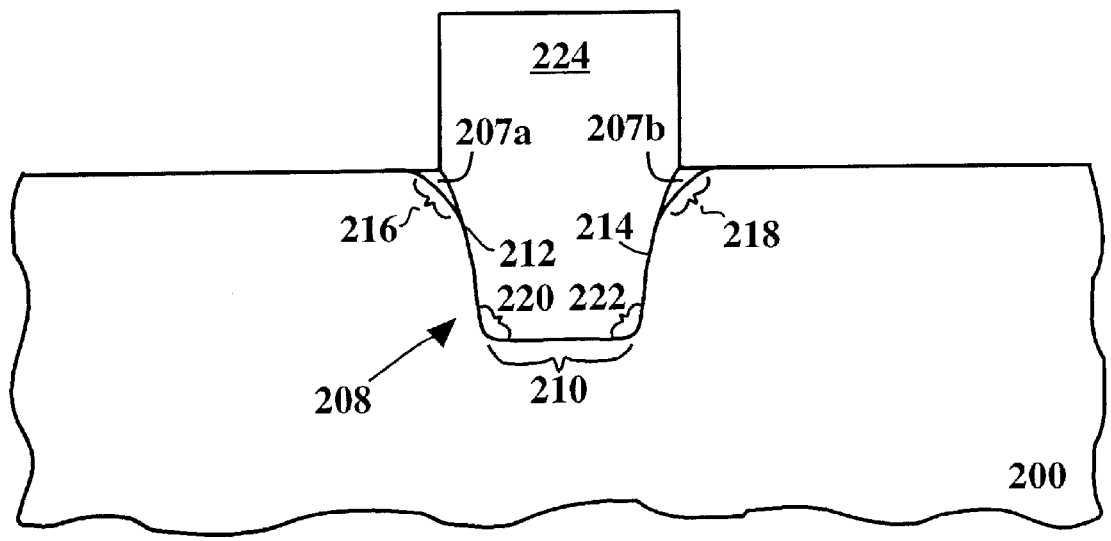
FIG. 2H is a cross-sectional view illustrating a step associated with the formation of a semiconductor device isolating structure in accordance with the present claimed invention.

Referring now to FIG. 2H, a cross-sectional view of semiconductor device isolating structure in accordance with the present invention is shown after oxide layer 202 and nitride layer 204 have been removed. As shown in FIG. 2H, portions 207a and 207b form a soft edge or "bird's beak" type structure which reduces stress between the top surface of semiconductor substrate 200 and dielectric material 224. Additionally, bird's beak structures 207a and 207b insure good adhesion between the top surface of semiconductor substrate 200 and dielectric material 224. Hence, a void-free semiconductor device isolating structure is formed. Furthermore, the present invention provides a leakage free semiconductor isolating device having good gate oxide integrity.

Thus, the present invention provides a semiconductor device isolating structure which does not have sharp stress-generating corners. The present invention also provides a semiconductor device isolating structure which does not have micro-trenches formed therein. Additionally, the present invention also provides a semiconductor device isolating structure which enhances sidewall bonding of a dielectric material thereto.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A soft edge induced local oxidation of silicon method for forming a trench in a semiconductor substrate comprising the steps of:

a) forming an opening in a mask layer overlying a semiconductor substrate such that a first region of said semiconductor substrate is exposed;

b) growing a field oxide structure on said first region of said semiconductor substrate, said field oxide structure extending beyond said first region of said semiconductor substrate such that a portion of said field oxide structure extends under said mask layer overlying said semiconductor substrate;

c) etching, within a first etching environment, said field oxide residing on said first region of said semiconductor substrate; and d) etching, within a second etching environment, a trench of a desired depth into said semiconductor substrate at said first region, said etching within said second etching environment further comprising the steps of:

d1) introducing helium into a second etching environment;

d2) introducing oxygen into said second etching environment;

d3) introducing chlorine into said second etching environment; and d4) introducing hydrogen bromide into said second etching environment.

2. The soft edge induced local oxidation of silicon method of claim 1 wherein step d1) further comprises the step of:

introducing helium into said second etching environment at a rate in the range of 80–180 standard cubic centimeters per minute.

3. The soft edge induced local oxidation of silicon method of claim 1 wherein step d2) further comprises the step of:

introducing oxygen into said second etching environment at a rate in the range of 2–5 standard cubic centimeters per minute.

4. The soft edge induced local oxidation of silicon method of claim 1 wherein step d3) further comprises the step of:

introducing chlorine into said second etching environment at a rate in the range of 50–100 standard cubic centimeters per minute.

5. The soft edge induced local oxidation of silicon method of claim 1 wherein step d4) further comprises the step of:

introducing hydrogen bromide into said second etching environment at a rate in the range of 50–100 standard cubic centimeters per minute.

6. The soft edge induced local oxidation of silicon method of claim 1 wherein step d) further comprises the step of:

etching, within said second etching environment, a semiconductor substrate until a trench formed into a semiconductor substrate at said first region such that a cross-section of said trench has:

a bottom surface;

a first sidewall extending to said bottom surface;

a second sidewall extending to said bottom surface;

a first field oxide region formed proximate to the interface of said first sidewall and the top surface of said semiconductor substrate, said semiconductor substrate having a first rounded corner formed at the intersection of said top surface of semiconductor substrate and said first sidewall; and a second field oxide region formed proximate to the interface of said second sidewall and the top surface of said semiconductor substrate, said semiconductor substrate having a second rounded corner formed at the intersection of said top surface of semiconductor substrate and said second sidewall.

7. The soft edge induced local oxidation of silicon method of claim 1 further comprising the step of:

e) filling said trench with a dielectric material.

8. A soft edge induced local oxidation of silicon method for forming a semiconductor device isolating structure comprising the steps of:

a) forming an opening in a mask layer overlying a semiconductor substrate such that a first region of said semiconductor substrate is exposed;

b) growing a field oxide structure on said first region of said semiconductor substrate, said field oxide structure extending beyond said first region of said semiconductor substrate such that a portion of said field oxide structure extends under said mask layer overlying said semiconductor substrate;

c) etching, within a first etching environment, said field oxide residing on said first region of said semiconductor substrate; and d) introducing helium into a second etching environment;

e) introducing oxygen into said second etching environment;

f) introducing chlorine into said second etching environment; and g) introducing hydrogen bromide into said second etching environment; and h) etching, within said second etching environment, a trench of a desired depth into said semiconductor substrate at said first region.

9. The soft edge induced local oxidation of silicon method of claim 8 wherein step d) further comprises the step of:

introducing helium into said second etching environment at a rate in the range of 80–180 standard cubic centimeters per minute.

10. The shallow trench isolation method of claim 8 wherein step e) further comprises the step of:

introducing oxygen into said second etching environment at a rate in the range of 2–5 standard cubic centimeters per minute.

11. The shallow trench isolation method of claim 8 wherein step f) further comprises the step of:

introducing chlorine into said second etching environment at a rate in the range of 50–100 standard cubic centimeters per minute.

12. The shallow trench isolation method of claim 8 wherein step g) further comprises the step of:

introducing hydrogen bromide into said second etching environment at a rate in the range of 50–100 standard cubic centimeters per minute.

13. The shallow trench isolation method of claim 8 further comprising the step of:

i) filling said trench with a dielectric material.

* * * * *

UNITED STATES PATENT AND TRADEMARK OFFICE
CERTIFICATE OF CORRECTION

PATENT NO. : 5,920,787
DATED : July 6, 1999
INVENTOR(S) : Jake Haskell, Olivier Laparra and Jie Zheng It is certified that error appears in the above-identified patent and that said Letters Patent is hereby corrected as shown below:

<u>Title page,</u>
Item [22], should read as follows:
-- Filed: Jan. 16, 1997 --

Signed and Sealed this

Twelfth Day of February, 2002

Attest:

JAMES E. ROGAN
Attesting Officer    Director of the United States Patent and Trademark Office